(12) United States Patent
Liu et al.

(10) Patent No.: US 9,607,805 B2
(45) Date of Patent: Mar. 28, 2017

(54) APPARATUS OF PLURAL CHARGED-PARTICLE BEAMS

(71) Applicant: Hermes Microvision Inc., Hsinchu (TW)

(72) Inventors: Xuedong Liu, San Jose, CA (US); Weiming Ren, San Jose, CA (US); Shuai Li, Beijing (CN); Zhongwei Chen, San Jose, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 15/150,858

(22) Filed: May 10, 2016

(65) Prior Publication Data

US 2016/0336142 A1 Nov. 17, 2016

Related U.S. Application Data

(60) Provisional application No. 62/160,031, filed on May 12, 2015.

(51) Int. Cl.
*H01J 37/04* (2006.01)
*H01J 37/28* (2006.01)

(52) U.S. Cl.
CPC .............. *H01J 37/28* (2013.01); *H01J 37/04* (2013.01); *H01J 2237/061* (2013.01); *H01J 2237/083* (2013.01); *H01J 2237/1532* (2013.01); *H01J 2237/1534* (2013.01); *H01J 2237/2817* (2013.01)

(58) Field of Classification Search
CPC .......... H01J 37/04; H01J 37/06; H01J 37/063; H01J 37/065; H01J 37/10; H01J 37/14; H01J 37/1474; H01J 37/26; H01J 37/28
See application file for complete search history.

(56) References Cited

U.S. PATENT DOCUMENTS

| | | | |
|---|---|---|---|
| 6,943,349 B2* | 9/2005 | Adamec ................. | H01J 37/04 250/306 |
| 7,244,949 B2 | 7/2007 | Knippelmeyer et al. | |
| 8,294,095 B2 | 10/2012 | Chen et al. | |
| 9,035,249 B1* | 5/2015 | Frosien ................... | H01J 37/05 250/310 |
| 2014/0168629 A1* | 6/2014 | Nishida ................. | H01J 37/304 355/77 |
| 2015/0364291 A1* | 12/2015 | Ogawa ................ | H01J 37/3174 250/491.1 |

OTHER PUBLICATIONS

U.S. Appl. No. 15/065,342, filed Mar. 9, 2016.
U.S. Appl. No. 15/078,369, filed Mar. 23, 2016.

* cited by examiner

*Primary Examiner* — David E Smith
(74) *Attorney, Agent, or Firm* — WPAT, PC; Justin King

(57) ABSTRACT

One modified source-conversion unit and one method to reduce the Coulomb Effect in a multi-beam apparatus are proposed. In the modified source-conversion unit, the aberration-compensation function is carried out after the image-forming function has changed each beamlet to be on-axis locally, and therefore avoids undesired aberrations due to the beamlet tilting/shifting. A Coulomb-effect-reduction means with plural Coulomb-effect-reduction openings is placed close to the single electron source of the apparatus and therefore the electrons not in use can be cut off as early as possible.

23 Claims, 11 Drawing Sheets

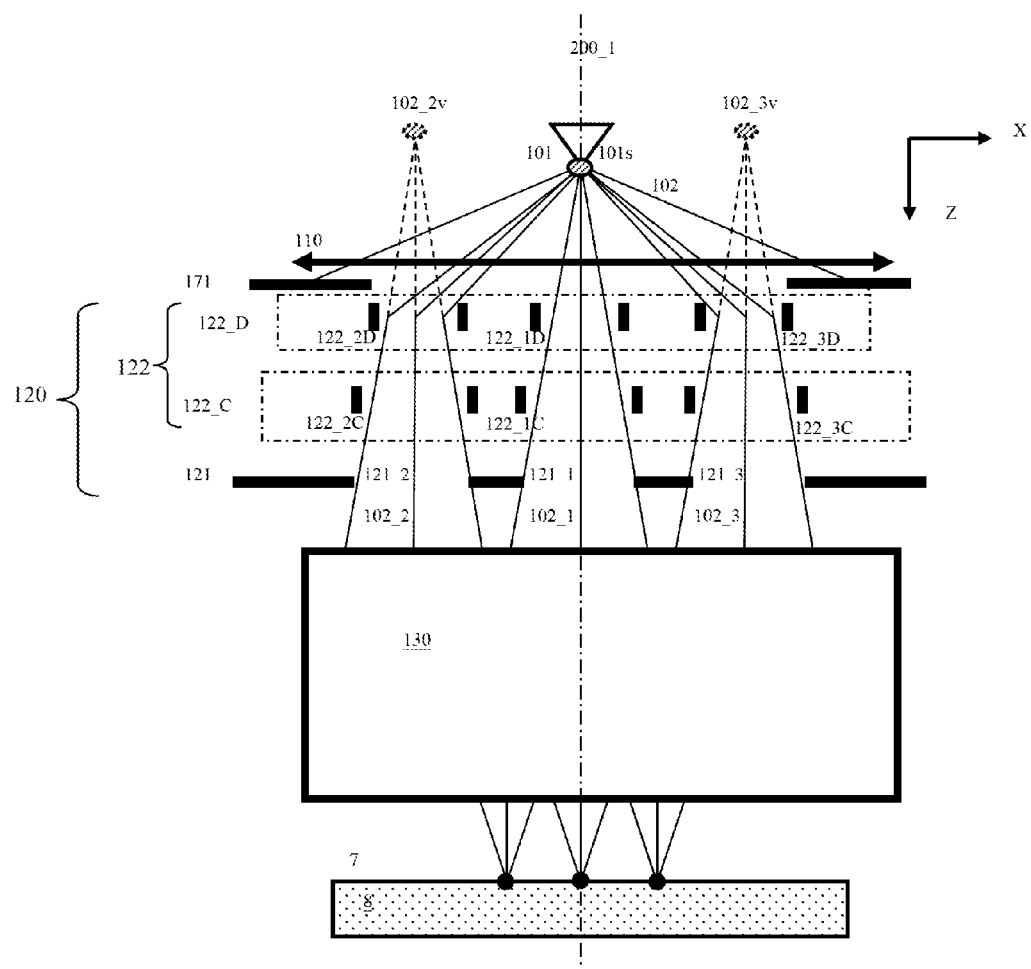
Figure 3 (Invention)

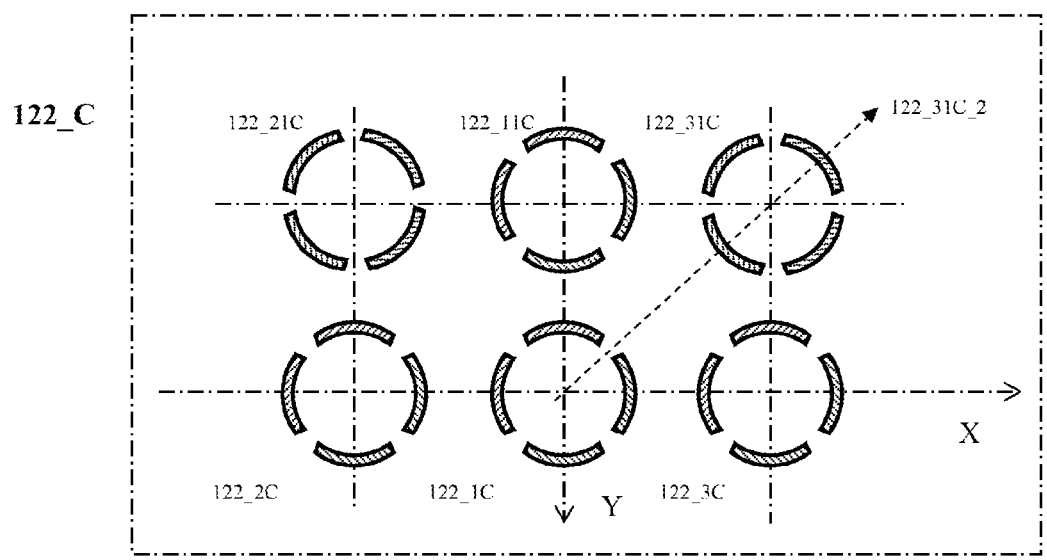
Figure 4 (Invention)

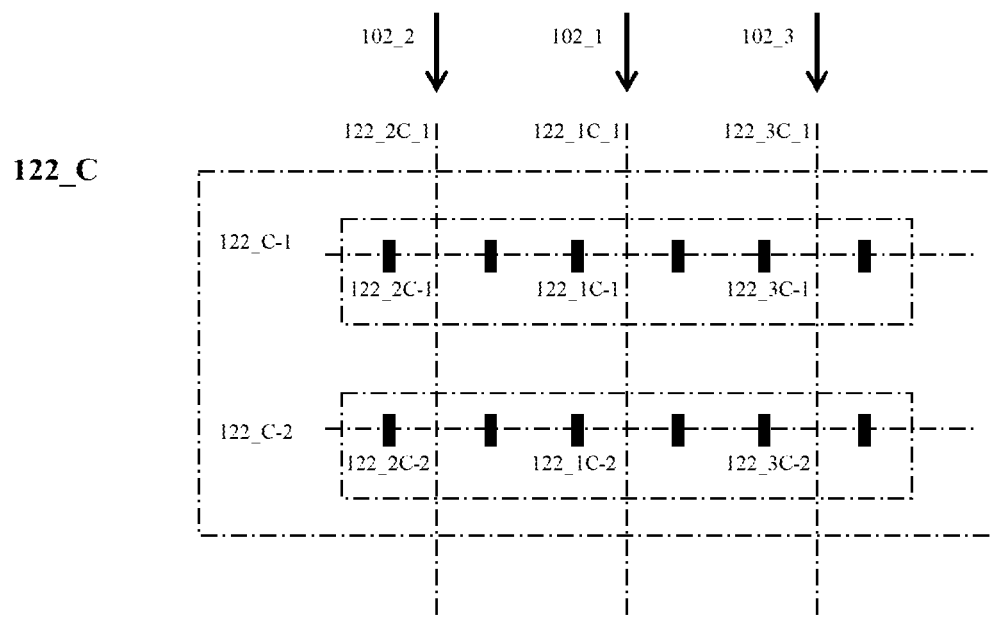
Figure 5A (Invention)
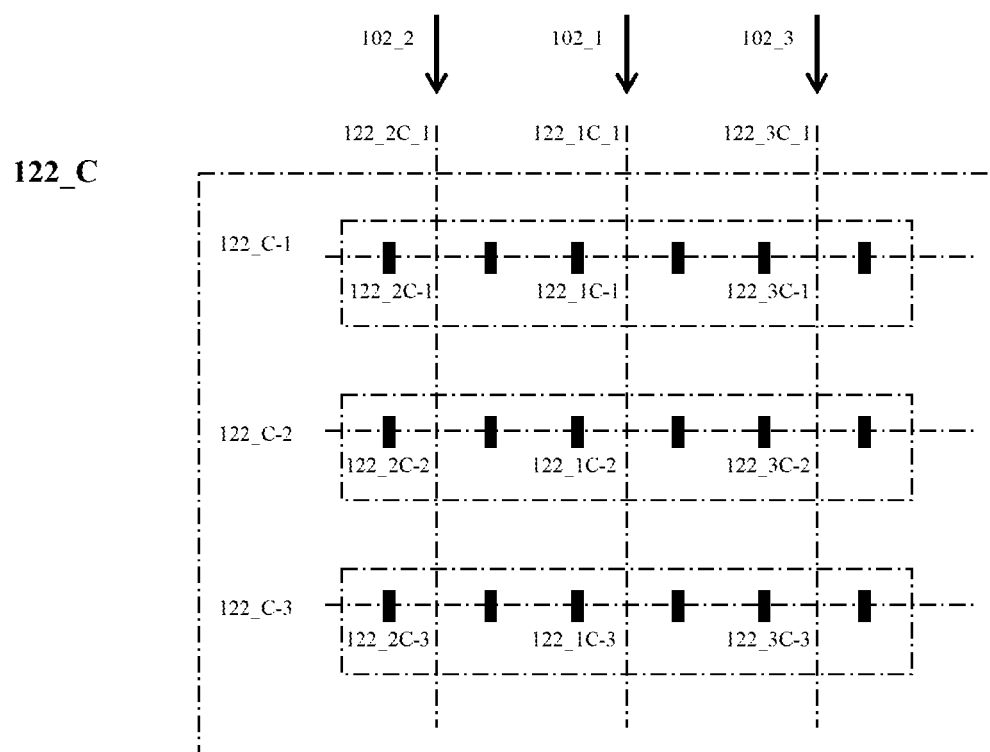
Figure 5B (Invention)

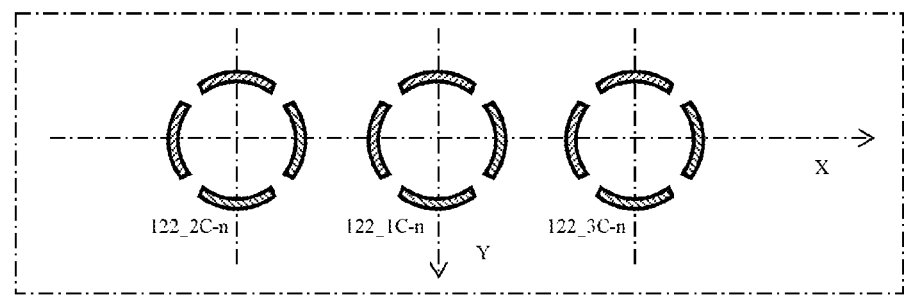
Figure 6A (Invention)
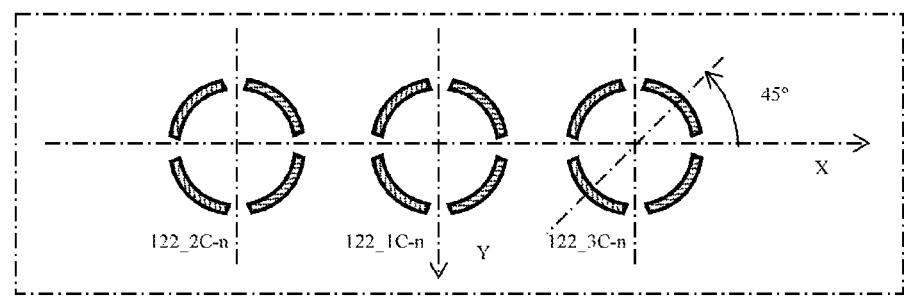
Figure 6B (Invention)
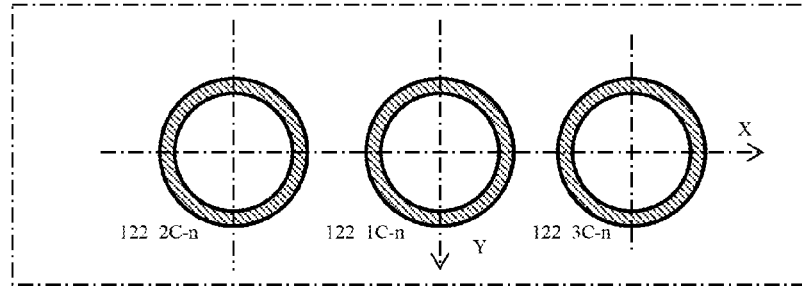
Figure 6C (Invention)

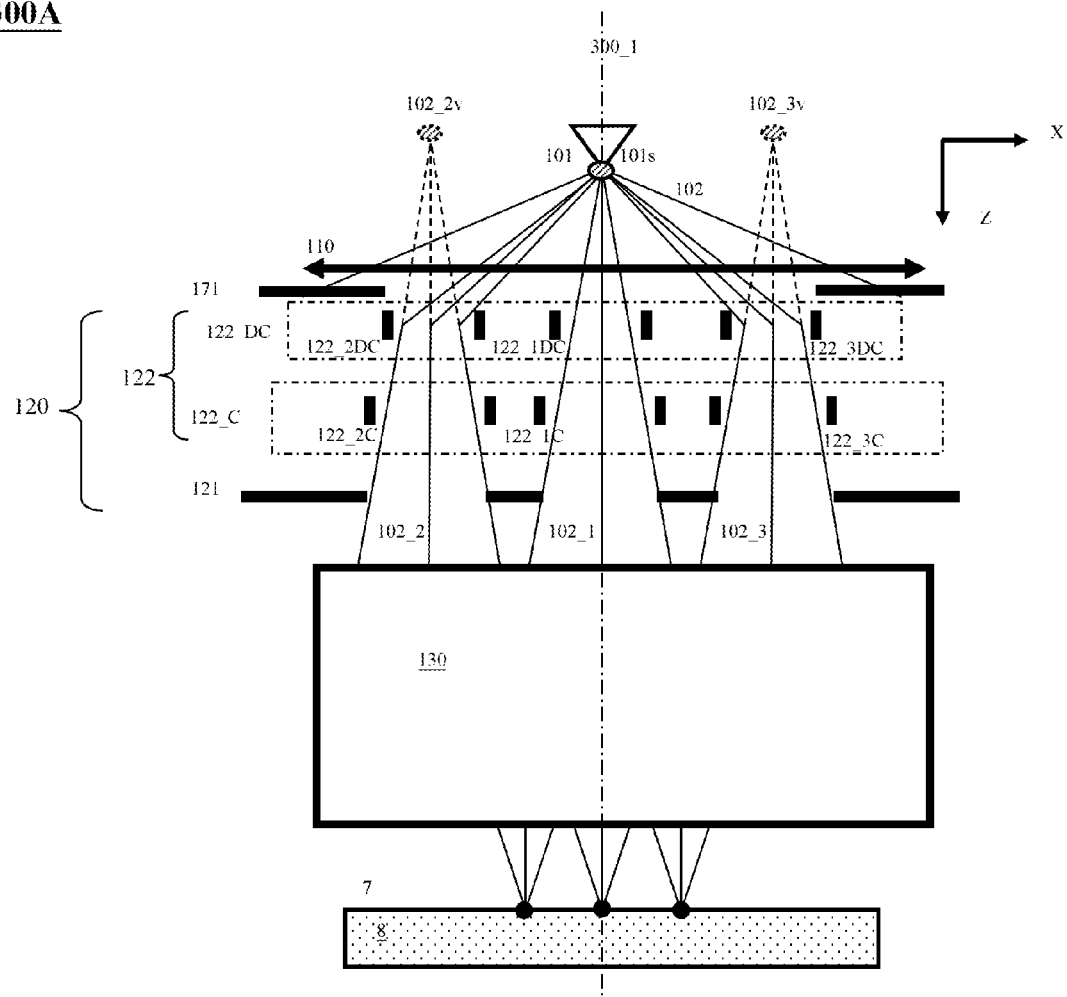
Figure 7 (Invention)

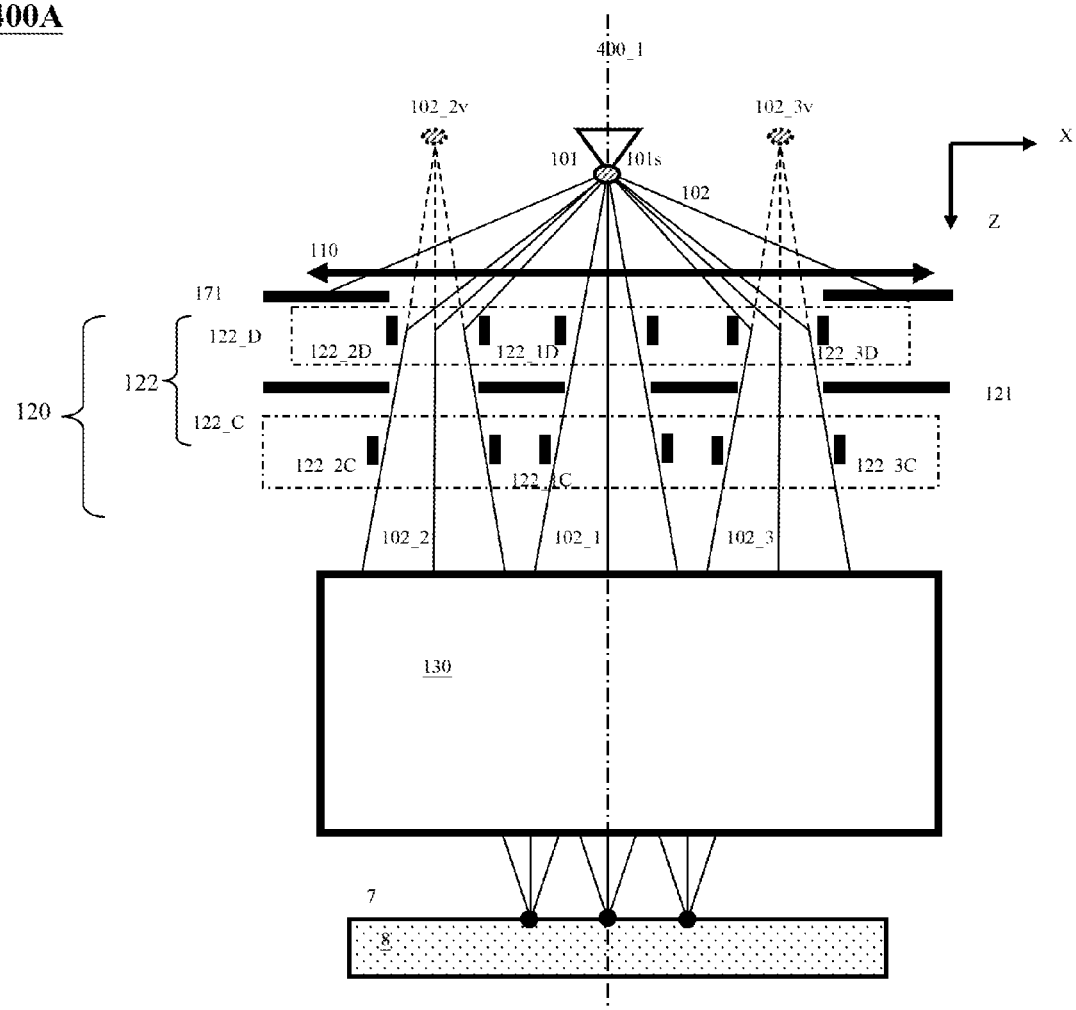
Figure 8 (Invention)

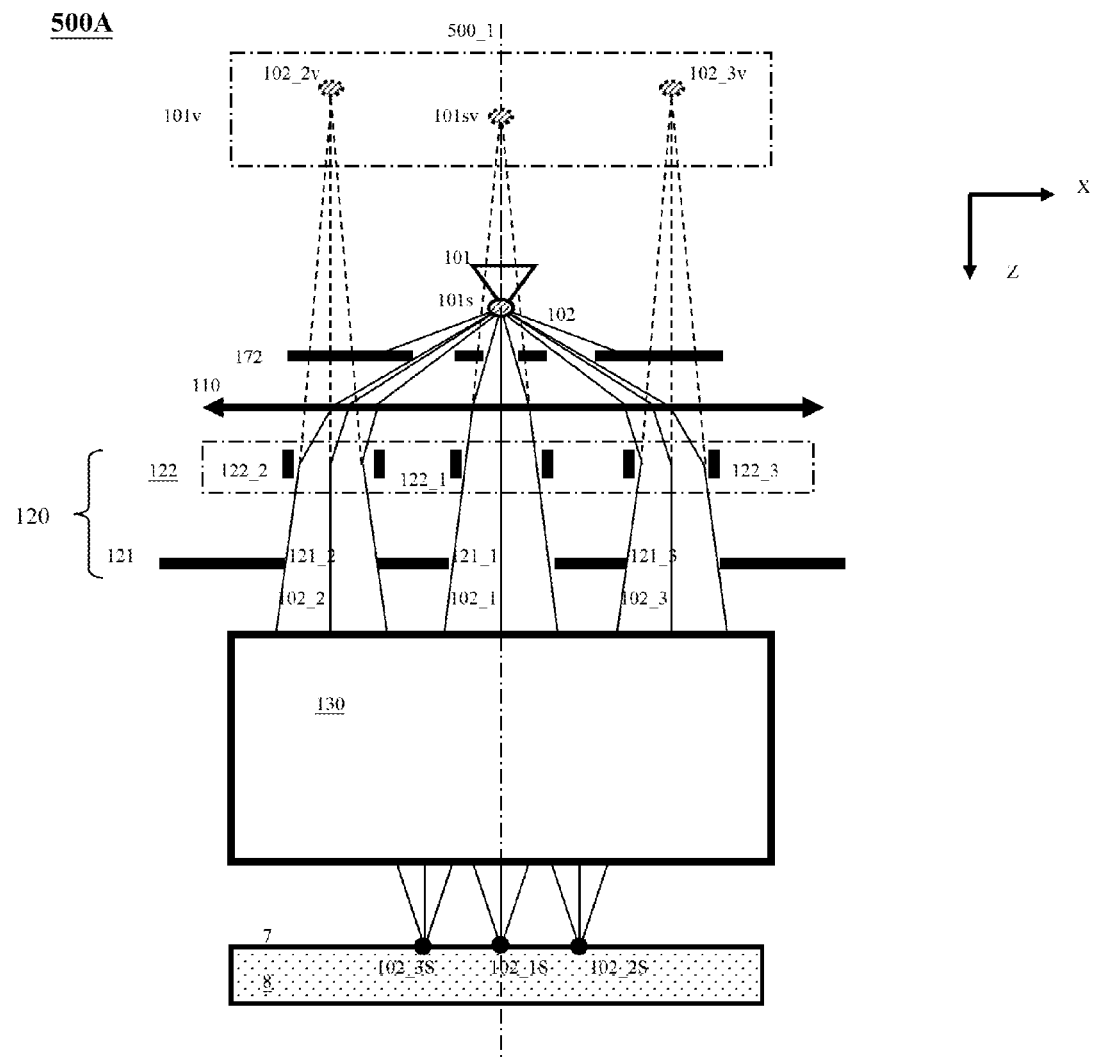
Figure 9 (Invention)

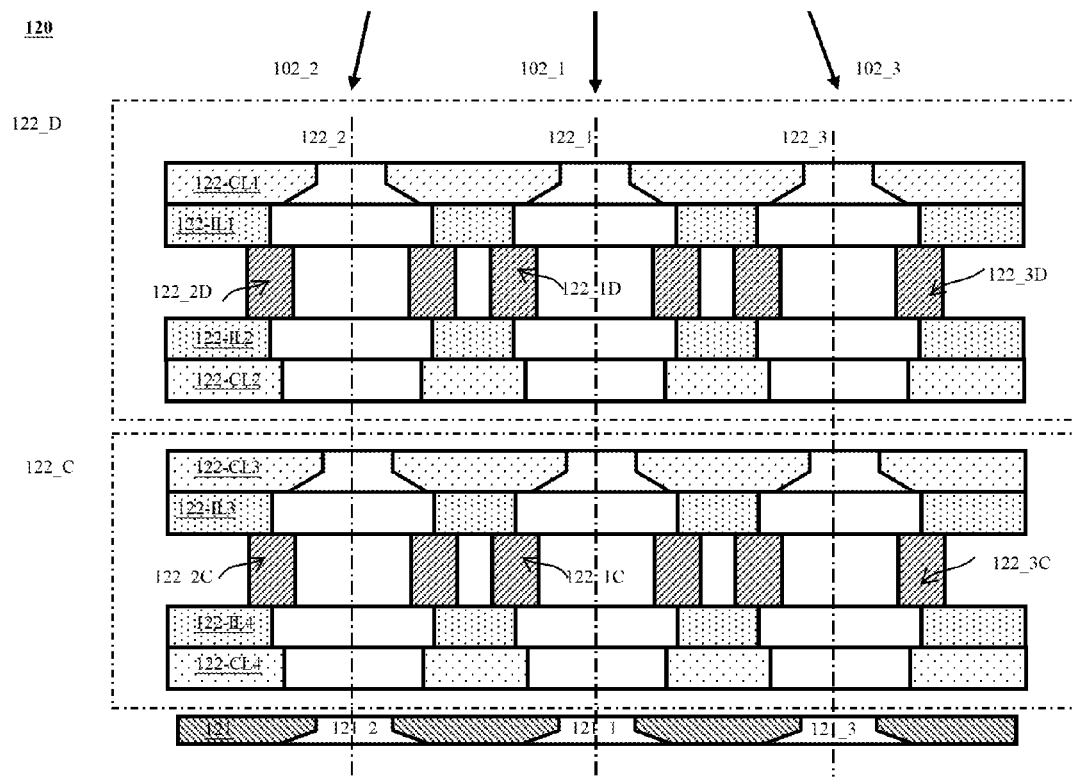
Figure 10A (Invention)
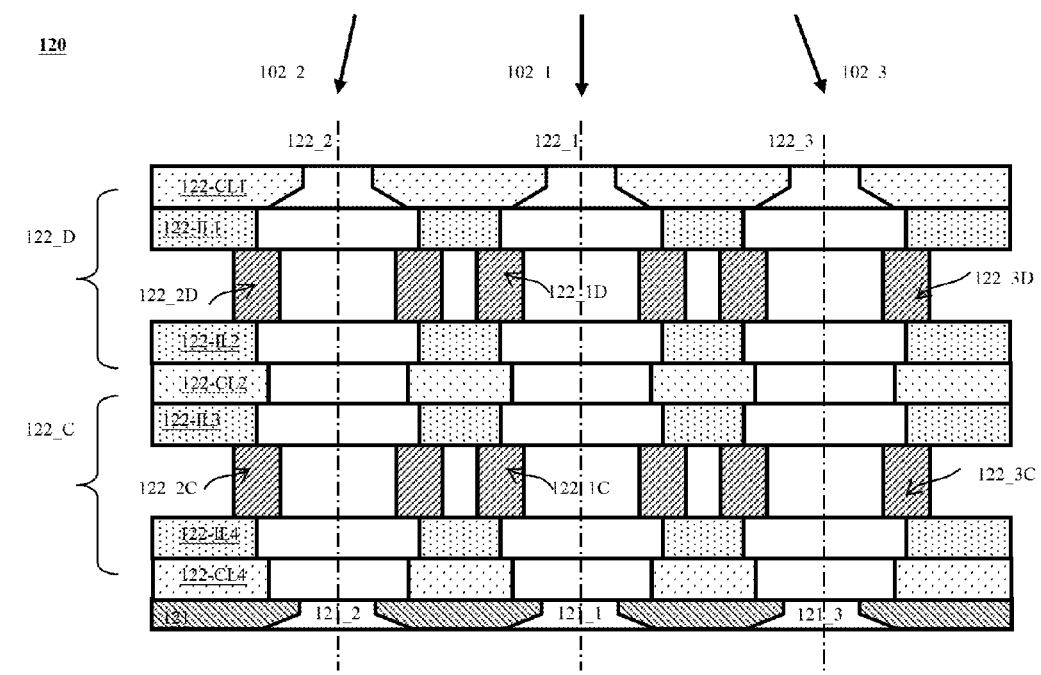
Figure 10B (Invention)

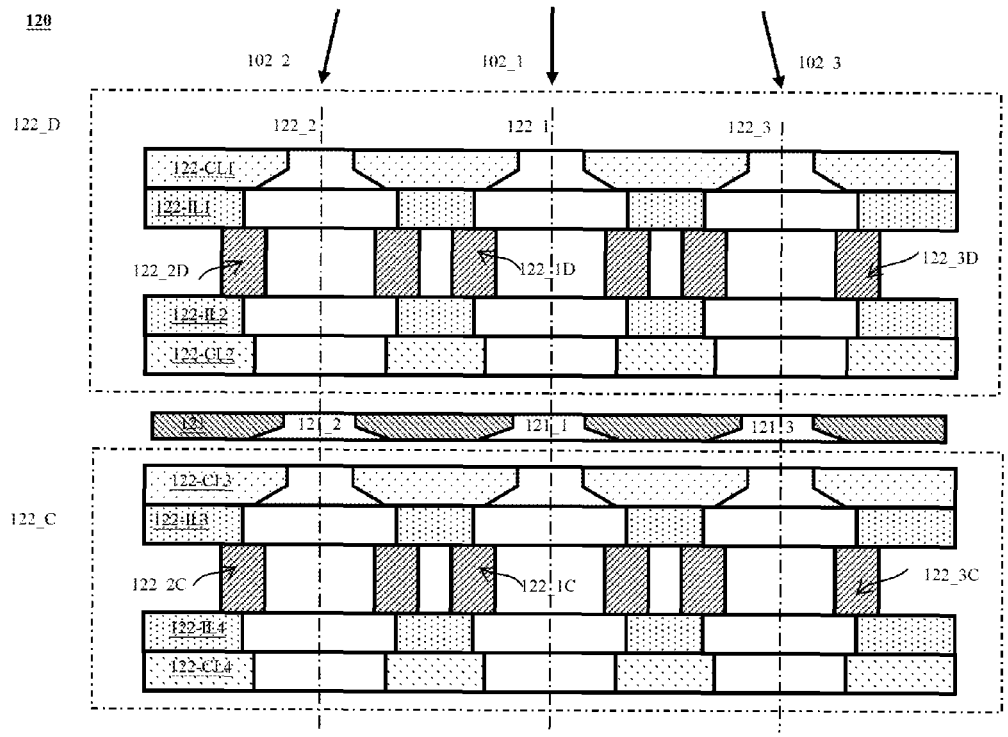
Figure 11A (Invention)
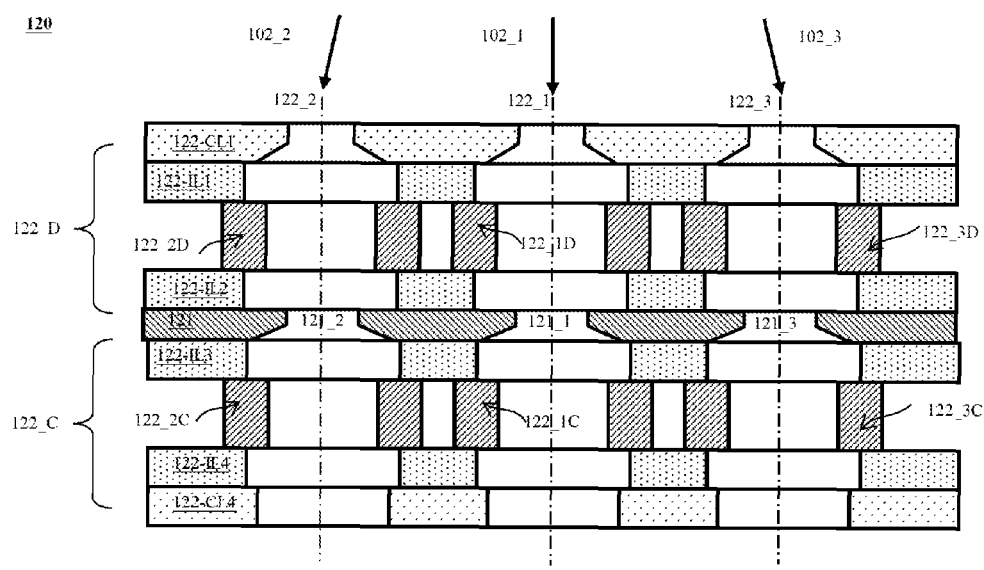
Figure 11B (Invention)

APPARATUS OF PLURAL CHARGED-PARTICLE BEAMS

CLAIM OF PRIORITY

This application claims the benefit of priority of U.S. provisional application No. 62/160,031 entitled to Xuedong Liu et al. filed on May 12, 2015 and entitled "Apparatus of Plural Charged-Particle Beams", the entire disclosures of which are incorporated herein by reference.

CROSS REFERENCE TO RELATED APPLICATIONS

This application is related to U.S. application Ser. No. 15/065,342 entitled to Weiming Ren et al. filed on Mar. 9, 2016 and entitled "Apparatus of Plural Charged-Particle Beams", the entire disclosures of which are incorporated herein by reference.

This application is related to U.S. application Ser. No. 15/078,369 entitled to Weiming Ren et al. filed on Mar. 23, 2016 and entitled "Apparatus of Plural Charged-Particle Beams", the entire disclosures of which are incorporated herein by reference.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect defects and/or particles on wafers/masks with high detection efficiency and high throughput in semiconductor manufacturing industry.

2. Description of the Prior Art

For manufacturing semiconductor IC chips, pattern defects and/or uninvited particles (residuals) inevitably appear on surfaces of wafers/masks during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although the higher and higher beam currents can be used to increase the throughputs, the superior spatial resolutions will be fundamentally deteriorated by Coulomb Effect.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. For the sample surface, the plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies≤50 eV) and back-scattered electrons (energies close to landing energies of the electrons). The secondary electrons from the plurality of small scanned regions can be respectively and simultaneously collected by a plurality of electron detectors. Consequently, the image of the large observed area including all of the small scanned regions can be obtained much faster than scanning the large observed area with a single beam The plurality of electron beams can be either from a plurality of electron sources respectively, or from a single electron source. For the former, the plurality of electron beams is usually focused onto and scans the plurality of small scanned regions by a plurality of columns respectively, and the secondary electrons from each scanned region are detected by one electron detector inside the corresponding column. The apparatus therefore is generally called as a multi-column apparatus. The plural columns can be either independent or share a multi-axis magnetic or electromagnetic-compound objective lens (such as U.S. Pat. No. 8,294,095). On the sample surface, the beam interval between two adjacent beams is usually as large as 30~50 mm.

For the latter, a source-conversion unit is used to generate a plurality of parallel real or virtual images of the single electron source. Each image is formed by one part or beamlet of the primary electron beam generated by the single electron source, and therefore can be taken as one sub-source emitting the one beamlet. In this way, the single electron source is virtually changed into a plurality of sub-sources forming a real or virtual multi-source array. Within the source-conversion unit, the beamlet intervals are at micro meter level so as to make more beamlets available, and hence the source-conversion unit can be made by semiconductor manufacturing process or MEMS (Micro Electro-Mechanical Systems) process. Naturally, one primary projection imaging system and one deflection scanning unit within one single column are used to project the plurality of parallel images onto and scan the plurality of small scanned regions respectively, and one secondary projection imaging system focuses the plurality of secondary electron beams therefrom to be respectively detected by a plurality of detection elements of one electron detection device inside the single column. The plurality of detection elements can be a plurality of electron detectors placed side by side or a plurality of pixels of one electron detector. The apparatus with a plurality of beamlets therefore is generally called as a multi-beam apparatus and the conventional apparatus with a single electron beam is called as a single-beam apparatus.

Conventionally, the source-conversion unit comprises one image-forming means, and one beamlet-forming means or one beamlet-limit means. The image-forming means basically comprises a plurality of image-forming elements, and each image-forming element can be a round lens or a deflector. The beamlet-forming means and the beamlet-limit means are respectively above and below the image-forming means and have a plurality of beamlet-limit openings. In one source-conversion unit with one beamlet-forming means, at first the plurality of beamlet-limit openings divides the primary electron beam into a plurality of beamlets, and then the plurality of image-forming elements (round lenses or deflectors) focuses or deflects the plurality of beamlets to form the plurality of parallel real or virtual images. U.S. Pat. No. 7,244,949 and U.S. Pat. No. 6,943,349 respectively propose an multi-beam apparatus with one source-conversion unit of this type. In one source-conversion unit with one beamlet-limit means, at first the plurality of image-forming elements (deflectors) deflects a plurality of beamlets of the primary electron beam to form the plurality of parallel virtual images, and then the plurality of beam-limit openings cuts off peripheral electrons of the plurality of beamlets respectively. The first cross reference proposes a multi-beam apparatus 100A with one source-conversion unit of this type, as shown in FIG. 1.

In FIG. 1, for sake of simplification, the primary projection imaging system 130 is not shown in detail and the secondary projection imaging system and the electron detection device are not shown. The single electron source 101 on the primary optical axis 100_1 generates the primary electron beam 102 seemingly coming from the crossover 101s. The condenser lens 110 focuses the primary electron beam 102 and thereby forming an on-axis virtual image 101sv of the crossover 101s. The peripheral electrons of the primary electron beam 102 are cut off by the main opening of the main aperture plate 171. The source-conversion unit 120 comprises the image-forming means 122 with three image-forming elements 122_1, 122_2 and 122_3, and a beamlet-limit means 121 with three beam-limit openings 121_1, 121_2 and 121_3. Each image-forming element functions as one micro-deflector. The beam-limit opening 121_1 is aligned with the primary optical axis 100_1, and therefore the image-forming element 122_1 is not necessary to comprise one micro-deflector. The image-forming elements 122_2 and 122_3 respectively deflect beamlets 102_2 and 102_3 of the primary electron beam 102, and thereby forming two off-axis virtual images 102_2V and 102_3v of the crossover 101s. The deflected beamlets 102_2 and 102_3 are perpendicularly incident onto the beamlet-limit means 121. The beam-limit openings 121_1, 121_2 and 121_3 respectively cut off the peripheral electrons of the center beamlet 102_1 and the deflected beamlets 102_2 and 102_3, and thereby limiting the currents thereof. The focusing power of the condenser lens 110 varies the current density of the primary electron beam 102, and therefore is able to change the currents of the beamlets 102_1~102_3. Consequently, three parallel virtual images 101sv, 102_2v and 102_3v form one virtual multi-source array low with variable currents. The primary projection imaging system 130 then images the virtual multi-source array low onto the being-observed surface 7 of the sample 8 and therefore form three probe spots 102_1S, 102_2s and 102_3s thereon. Each of the image-forming elements 122_1~122_3 can have a dipole configuration (with two electrodes) which can generate one deflection field in its required deflection direction, or a quadrupole or 4-pole configuration (with four electrodes) which can generate one deflection field in any direction.

To compensate the inherent off-axis aberrations and the manufacturing derivative aberrations of the probe spots 102_1s, 102_2s and 102_3s, each of the image-forming elements 122_1, 122_2 and 122_3 can further function as one micro-compensator to compensate the field curvature aberration and the astigmatism aberration. Accordingly, each image-forming element can have a 4-pole lens (with four electrodes whose inner surfaces form a cylindrical surface) which can generate one deflection field in any direction, one quadrupole field in one specific direction and one round-lens field, or octupole or 8-pole lens (with eight electrodes whose inner surfaces form a cylindrical surface) which can generate one deflection field and one quadrupole field in any directions. The 4-pole lens needs to be oriented to make the specific direction of the quadrupole field match the direction of the astigmatism aberration. If a lot of beamlets is used, it may be difficult to manufacture a large number of 8-pole lenses or 4-pole lenses each with a specific orientation. In this case, for each beamlet, a pair of 4-pole lenses (such as 122_2dc-1 and 122_2dc-2) can be used in the way shown in FIGS. 2A-2C. The upper and lower 4-pole lenses of one pair of 4-pole lenses are respectively placed in the upper and lower layers 122-1 and 122-2, aligned with each other and have a 45° difference in azimuth or orientation. For each image-forming element, the deflection field in any desired deflection direction and the round-lens field can be generated by either or both of the upper and lower 4-pole lenses, and the quadrupole field in any desired compensation direction can be generated by both of the upper and lower 4-pole lenses.

In FIG. 1 and FIG. 2A, each image-forming element performs the image-forming function and aberration-compensation function simultaneously. The performance of the aberration-compensation function with respect to a tilting beamlet will be inferior to a normal beamlet, and this will finally limit the available image resolutions of the apparatus. Accordingly, it is necessary to provide an apparatus of plural charged-particle beams, which can avoid the foregoing performance deterioration.

SUMMARY OF THE INVENTION

The object of this invention is to modify one source-conversion unit of one multi-beam apparatus in CROSS REFERENCE to avoid generating undesired aberrations during performing the aberration-compensation function. In the modified source-conversion unit, the image-forming function and the aberration-compensation function are done separately. The aberration-compensation function is carried out after the image-forming function has changed each beamlet to be locally on-axis with respect to one corresponding micro-compensator, and therefore avoids additional aberrations due to beamlet tilting/shifting. The invention also proposes a method to reduce the impact of Coulomb Effect as much as possible in one multi-beam apparatus. A Coulomb-effect-reduction means with plural Coulomb-effect-reduction openings is placed close to the single electron source of the apparatus and therefore the electrons not in use can be cut off as early as possible. Consequently, the image resolution of the apparatus can be improved.

Accordingly, the invention therefore provides a source-conversion unit, which comprises means for forming a plurality of virtual images of a single charged-particle source which generates a charged-particle beam, by using a plurality of micro-deflectors and a plurality of micro-compensators in sequence. The plurality of micro-deflectors converts the single charged-particle beam into a plurality of parallel beamlets and forms the plurality of virtual images respectively, and the plurality of micro-compensators compensates aberrations of the plurality of virtual images. The source-conversion unit also comprises means for limiting a current of each of the plurality of beamlets.

The present invention provides a source-conversion unit of an electron source, which comprises an image-forming means, and a beamlet-limit means with a plurality of beamlet-limit openings. The image-forming means comprises a micro-deflector array with a plurality of micro-deflectors and a micro-compensator array with a plurality of micro-compensators, and each micro-deflector is aligned with one micro-compensator and one beamlet-limit opening. That each micro-deflector can deflect one beamlet of an electron beam generated by the electron source to forms one virtual image thereof and enter that one micro-compensator along an optical axis thereof. That one micro-compensator can influence that one beamlet to add certain amounts of astigmatism aberration and/or field curvature aberration to the virtual image. That one beamlet-limit opening cuts off peripheral electrons of that one beamlet and thereby limiting a current thereof. The beamlet-limit means is preferred below the micro-deflector array.

That one micro-compensator comprises a plurality of combined sub micro-compensators. The micro-compensator array comprises a first micro-compensator layer with a plurality of first sub micro-compensators and a second micro-compensator layer with a plurality of second sub micro-compensators, one first sub micro-compensator and one second sub micro-compensator aligned with each other are two of the plurality of combined sub micro-compensators.

For that one micro-compensator, the first sub micro-compensator and the second sub micro-compensator can be respectively a 4-pole lens and have a 45° difference in orientation. The micro-compensator array may further comprises a third micro-compensator layer with a plurality of third sub micro-compensators, and one third sub micro-compensator aligned with the second sub micro-compensator is one of the plurality of combined sub micro-compensators. In this case, for that one micro-compensator, the first sub micro-compensator and the second sub micro-compensator are respectively a 4-pole lens and have a 45° difference in orientation, and the third sub micro-compensator is a round-lens.

The source-conversion unit may further comprise a first-upper electric-conduction plate with a plurality of first-upper through-holes and a first-lower electric-conduction plate with a plurality of first-lower through-holes, which are respectively above and below electrodes of the plurality of micro-deflectors to avoid radiation damage due to the electron beam and keep electric fields thereof therebetween.

The source-conversion unit may further comprise a second-upper electric-conduction plate with a plurality of second-upper through-holes and a second-lower electric-conduction plate with a plurality of second-lower through-holes, which are respectively above and below electrodes of the plurality of micro-compensators to avoid radiation damage due to corresponding beamlets and keep electric fields thereof therebetween.

The present invention also provides a multi-beam apparatus, which comprises an electron source, a condenser lens below the electron source, a source-conversion unit below the condenser lens, a primary projection imaging system below the source-conversion unit and comprising an objective lens, a deflection scanning unit inside the primary projection imaging system, a sample stage below the primary projection imaging system, a beam separator above the objective lens, a secondary projection imaging system above the beam separator, and an electron detection device with a plurality of detection elements. The source-conversion unit comprises an image-forming means and a beamlet-limit means with a plurality of beam-limit openings. The image-forming means comprises a micro-deflector array with a plurality of micro-deflectors and a micro-compensator array with a plurality of micro-compensators. The beamlet-limit means is below said micro-deflector array. An optical axis of each micro-compensator is parallel to a primary optical axis of the apparatus and aligned with one of the plurality of micro-deflectors and one of the plurality of beamlet-limit openings. The electron source, the condenser lens, the source-conversion unit, the primary projection imaging system, the deflection scanning unit and the beam separator are aligned with the primary optical axis. The secondary projection imaging system and the electron detection device are aligned with a secondary optical axis of the apparatus, and the secondary optical axis is not parallel to the primary optical axis. The sample stage can sustain a sample with a being-observed surface facing to the objective lens. The electron source can generate a primary electron beam along the primary optical axis. The plurality of micro-deflectors respectively deflects a plurality of beamlets of the primary electron beam to be incident onto the plurality of micro-compensators along optical axes thereof and therefore form a plurality of parallel virtual images of the electron source. The plurality of micro-compensators respectively influences the plurality of beamlets with certain amounts of astigmatism aberrations and/or field curvature aberrations. The plurality of beam-limit openings respectively cuts off peripheral electrons of the plurality of beamlets and therefore limits currents thereof, and the currents can be varied together by adjusting focusing power of the condenser lens. The primary projection imaging system focuses the plurality of beamlets, images the plurality of parallel virtual images onto the surface and forms a plurality of probe spots thereon. The certain amounts of astigmatism aberrations and/or field curvature aberrations compensate astigmatism aberrations and/or field curvature aberrations generated by the condenser lens and/or the primary projection imaging system so as to reduce sizes of the plurality of probe spots. The deflection scanning unit deflects the plurality of beamlets to scan the plurality of probe spots respectively over a plurality of scanned regions within an observed area on the surface. A plurality of secondary electron beams is generated by the plurality of probe spots respectively from the plurality of scanned regions and in passing focused by the objective lens. The beam separator then deflects the plurality of secondary electron beams to the secondary projection imaging system. The secondary projection imaging system focuses and keeps the plurality of secondary electron beams to be detected by the plurality of detection elements respectively, and each detection element therefore provides an image signal of one corresponding scanned region.

That each micro-compensator can comprise a plurality of combined sub micro-compensators. Therefore the micro-compensator array can comprise a first micro-compensator layer with a plurality of first sub micro-compensators and a second micro-compensator layer with a plurality of second sub micro-compensators, and one first sub micro-compensator and one second sub micro-compensator aligned with each other are two of the plurality of combined sub micro-compensators. (claim 13) For that each micro-compensator, the first sub micro-compensator and the second sub micro-compensator are respectively a 4-pole lens and have a 45° difference in orientation.

The micro-compensator array may further comprise a third micro-compensator layer with a plurality of third sub micro-compensators, and one third sub micro-compensator aligned with the second sub micro-compensator is one of the plurality of combined sub micro-compensators. For that each micro-compensator, the first sub micro-compensator and the second sub micro-compensator can be respectively a 4-pole lens and have a 45° difference in orientation, and the third sub micro-compensator can be a round-lens.

The image-forming means may comprise a first-upper electric-conduction plate with a plurality of first-upper through-holes and a first-lower electric-conduction plate with a plurality of first-lower through-holes, which are respectively above and below electrodes of the plurality of micro-deflectors to avoid radiation damage due to the primary electron beam and keep electric fields thereof therebetween.

The image-forming means may comprise a second-upper electric-conduction plate with a plurality of second-upper through-holes and a second-lower electric-conduction plate with a plurality of second-lower through-holes, which are respectively above and below electrodes of the plurality of micro-compensators to avoid radiation damage due to corresponding beamlets and keep electric fields thereof therebetween.

The multi-beam apparatus may further comprise a Coulomb-effect-reduction means which is between the electron source and the condenser lens and comprises a plurality of Coulomb-effect-reduction openings, wherein most electrons within the primary electron beam and not constituting the plurality of beamlets, will not pass through the plurality of Coulomb-effect-reduction openings.

The present invention also provides a method for converting a single charged particle source into a plurality of virtual sub-sources, which comprises steps of deflecting a charged-particle beam of the single charged particle source into a plurality of parallel beamlets which forms the plurality of virtual images respectively, correcting aberrations of the plurality of virtual, and cutting a current of each of the plurality of beamlets. Each of the plurality of virtual images is one of the plurality of sub-sources The present invention provides a method to configure a source-conversion unit of an electron source, which comprises steps of providing an image-forming means with a micro-deflector array and a micro-compensator array, and providing a beamlet-limit means with a plurality of beamlet-limit openings. The micro-deflector array comprises a plurality of micro-deflectors, and the micro-compensator array comprises a plurality of micro-compensators. Each micro-deflector is aligned with one micro-compensator and one beamlet-limit opening. That each micro-deflector deflects one beamlet of an electron beam generated by the electron source to form one virtual image thereof and is incident onto that one micro-compensator along an optical axis thereof. That one micro-compensator influences that one beamlet to add certain amounts of astigmatism aberration and/or field curvature aberration to that one virtual image. That one beamlet-limit opening cuts off peripheral electrons of that one beamlet and thereby limiting a current thereof.

The method may further comprise a step of providing a first-upper electric-conduction plate with a plurality of first-upper through-holes and a first-lower electric-conduction plate with a plurality of first-lower through-holes respectively, which are respectively above and below electrodes of the plurality of micro-deflectors to avoid generating radiation damage due to the electron beam and keep electric fields thereof therebetween.

The method may further comprise a step of providing a second-upper electric-conduction plate with a plurality of second-upper through-holes and a second-lower electric-conduction plate with a plurality of second-lower through-holes, which are respectively above and below electrodes of the plurality of micro-compensators to avoid generating radiation damage due to corresponding beamlets and keep electric fields thereof therebetween.

The present invention provides a method to obtain a plurality of sub-sources from an electron source, which comprises steps of performing an image-forming function by a plurality of micro-deflectors, performing an aberration-compensation function by a plurality of micro-compensators, and performing a current-limit function by plurality of beamlet-limit apertures. The image-forming function provides a plurality of parallel virtual images of the electron source and each virtual image becomes one of the plurality of sub-sources. The aberration-compensation function adds certain amounts of specific aberrations to the plurality of sub-sources respectively, and the current-limit function limits currents of the plurality of sub-sources respectively. The plurality of micro-deflectors respectively deflect a plurality of beamlets of an electron beam generated by the electron source, and the plurality of beamlets forms the plurality of parallel virtual images and enters the plurality of micro-compensators along optical axes thereof. The plurality of micro-compensators respectively influences the plurality of beamlets with the certain amounts of specific aberrations. The plurality of beamlet-limit apertures respectively cuts off peripheral electrons of the plurality of beamlets to limit currents thereof.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 3 is a schematic illustration of a configuration of a new multi-beam apparatus in accordance with one embodiment of the present invention.

FIG. 4, FIG. 5A and FIG. 5B are respectively a schematic illustration of one configuration of the micro-compensation array in FIG. 3.

FIGS. 6A, 6B and 6C are schematic illustrations of one part of the configuration of the micro-compensation array in FIG. 5A or FIG. 5B.

FIG. 7 is a schematic illustration of a configuration of a new multi-beam apparatus in accordance with another embodiment of the present invention.

FIG. 8 is a schematic illustration of a configuration of a new multi-beam apparatus in accordance with another embodiment of the present invention.

FIG. 9 is a schematic illustration of a configuration of a new multi-beam apparatus in accordance with another embodiment of the present invention.

FIGS. 10A and 10B are respectively a schematic illustration of one embodiment of the source-conversion unit in FIG. 3 and FIG. 7.

FIGS. 11A and 11B are respectively a schematic illustration of one embodiment of the source-conversion unit in FIG. 8.

DETAILED DESCRIPTION OF EXAMPLE EMBODIMENTS

Figure 1:
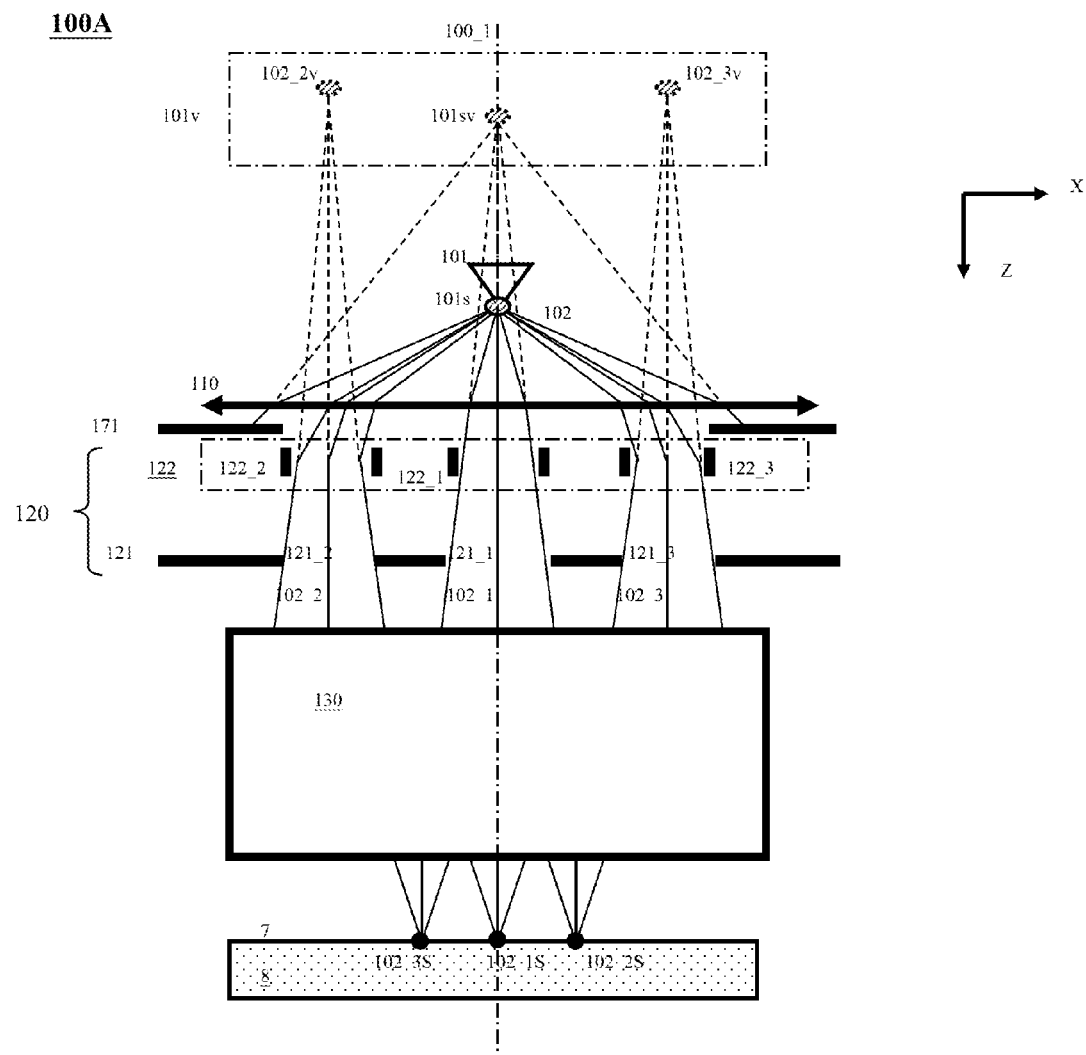
FIG. 1 is a schematic illustration of one configuration of a conventional multi-beam apparatus.
Figure 2A:
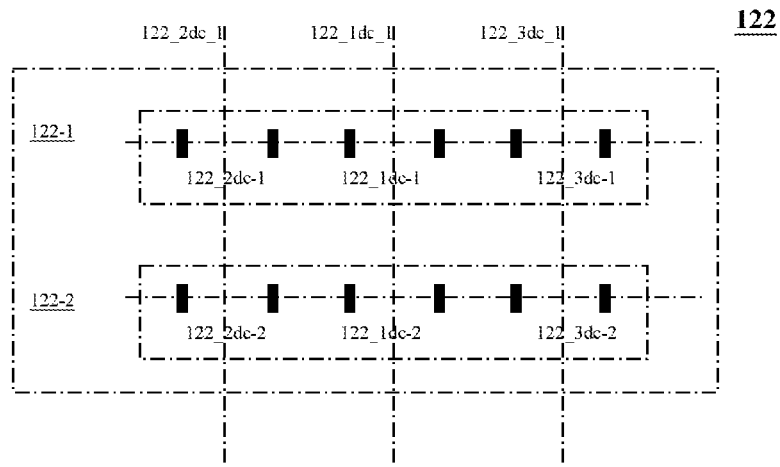
FIGS. 2A-2C are schematic illustrations of one conventional configuration of one image-forming means in a conventional source-conversion unit.
Figure 2B:
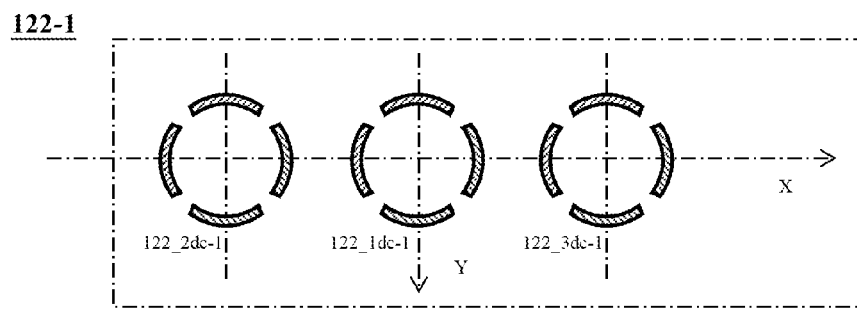
Figure 2C:
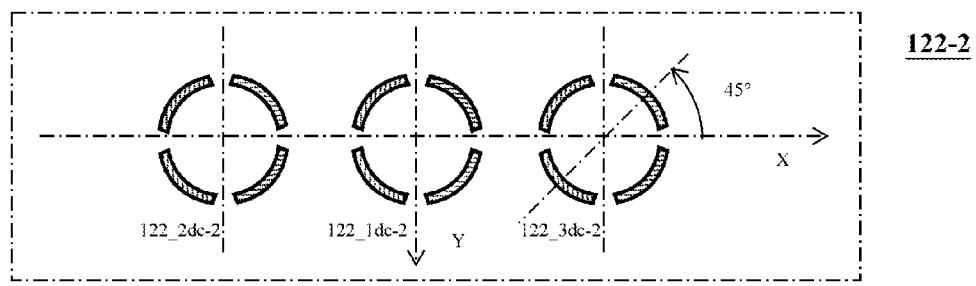

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described. For sake of clarity, only three beamlets are available in the drawings, but the number of beamlets can be anyone.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a lens (round or multi-pole), an imaging system or an apparatus", "radial" means "in a direction perpendicular to the optical axis", "on-axial" means "on or aligned with the optical axis" and "off-axis" means "not on or not aligned with the optical axis".

In this invention, "an imaging system is aligned with an optical axis" means "all the electron optics elements (such round lens and multi-pole lens) are aligned with the optical axis".

In this invention, X, Y and Z axe form Cartesian coordinate. The optical axis of the primary projection imaging system is on the Z-axis, and the primary electron beam travels along the Z-axis.

In this invention, all terms relate to through-holes, openings and orifices mean openings or holes penetrated through one plate.

In this invention, "primary electrons" means "electrons emitted from an electron source and incident onto a being-observed or inspected surface of a sample, and "secondary electrons" means "electrons generated from the surface by the "primary electrons".

Basic configurations of two types of multi-beam apparatuses for observing or inspecting a surface of a sample are disclosed in CROSS REFERENCE. In one first-type apparatus, the surface is perpendicular to the optical axis thereof as shown in FIG. 1, and in one second-type apparatus the surface tilts with respect to the optical axis thereof. The methods and the embodiments proposed in the present invention can be used in both one first-type apparatus and one second-type apparatus so as to improve the performances thereof. In the next descriptions, only the first-type apparatus is taken as an example. For sake of simplification, the primary projection imaging system, the secondary projection imaging system and the electron detection device are not shown and not mentioned in the illustrations and the description of the embodiments respectively.

FIG. 3 shows one embodiment of the modified source-conversion unit 120 in one first-type apparatus 200A. The single electron source 101, the common condenser lens 110, the main aperture plate 171, the source-conversion unit 120, and the primary projection imaging system 130 are placed along and aligned with the primary optical axis 200_1. The source-conversion unit 120 comprises one image-forming means 122 and one beamlet-limit means 121 with three beamlet-limit apertures (or openings) 121_1, 121_2 and 121_3. The image-forming means 122 comprises one micro-deflector array 122_D with three micro-deflectors 122_1D, 122_2D and 122_3D, and one micro-compensator array 122_C with three micro-compensators 122_1C, 122_2C and 122_3C. The beamlet-limit means 121 is a beamlet-limit-aperture array. The optical axes of the three micro-deflectors and the three micro-compensators are parallel to the primary optical axis 200_1, and each of the three micro-deflectors is aligned with one of the three micro-compensators and one of the three beamlet-limit openings. For example, the micro-deflector 122_2D is aligned with the micron-compensator 122_2C and the beamlet-limit opening 121_2. Here the micro-deflector 122_1D, the micro-compensator 122_1C and the beamlet-limit opening 121_1 are shown on the primary optical axis 200_1, but they can be off the primary optical axis 200_1.

The single electron source 101 generates a primary electron beam 102 with high energy (such as 8~20 keV), a high angular intensity (such as 0.5~5 mA/sr) and a crossover (virtual or real) 101s shown by the on-axis oval mark here. Therefore it is convenient to think that the primary electron beam 102 is emitted from the crossover 101s, and the single electron source 101 is simplified to be the crossover 101s.

The primary electron beam 102 passes through the condenser lens no without focusing influence and its peripheral electrons are cut off by the main opening of the main aperture plate 171. The micro-deflectors 122_2D and 122_3D respectively deflect beamlets 102_2 and 102_3 of the primary electron beam 102 to be parallel or substantially parallel to the primary optical axis 200_1. The deflected beamlets 102_2 and 102_3 respectively form the off-axis virtual images 102_2v and 102_3v of the crossover 101s of the single electron source 101. Then the three beamlets 102_1, 102_2 and 102_3 pass through the corresponding micro-compensators 122_1C, 122_2C and 122_3C along the optical axes thereof. Each micro-compensator generates a round-lens field and a quadrupole field, and thereby accordingly adding specific values of focusing or field curvature aberration and astigmatism aberration to the corresponding beamlet. In this way, each micro-compensator avoids generating additional aberrations due to beamlet tilting and/or shifting.

Next the beamlet-limit openings 121_1, 121_2 and 121_3 cut off the peripheral electrons of the beamlets 102_1, 102_2 and 102_3 respectively, and thereby limiting the currents thereof. The primary projection imaging system 130 focuses the beamlets 102_1, 102_2 and 102_3 and accordingly images the crossover 101s and its two parallel off-axis virtual images 102_2v and 102_3v onto the being-observed surface 7 and therefore forms three probe spots thereon. For each probe spot, the specific values of the field curvature aberration and astigmatism aberration generated by the corresponding micro-compensator compensate the corresponding aberrations due to the primary projection imaging system 130. The currents of the three probe spots can be varied by turning on the condenser lens no to focus the primary electron beam 102 to a certain degree. Increasing the focusing power of the condenser lens no will increase the current density of the primary electron beam 102 incident onto the source-conversion unit 120, and accordingly increase the currents of the three beamlets 102_1, 102_2 and 102_3. In this case, the foregoing specific values of the field curvature aberration and astigmatism aberration will compensate the corresponding aberrations due to the condenser lens no and the primary projection imaging system 130.

Same as the prior art, each of the three micro-deflectors 122_1D, 122_2D and 122_3D can have a dipole configuration (with two electrodes) which can generate one deflection field in its required deflection direction, or a quadrupole or 4-pole configuration (with four electrodes) which can generate one deflection field in any direction.

Each of the three micro-compensators 122_1C, 122_2C and 122_3C can be a 4-pole lens (with four electrodes whose inner surfaces form a cylindrical surface) with a specific orientation, and therefore can generate one round-lens field and one quadrupole field in the direction of the compensated astigmatism aberration as shown in FIG. 4. For the sake of clarity, three more micro-compensators are shown. The micro-compensator 122_3C is oriented to generate a quadrupole field in X direction, and the micro-compensator 122_31C is oriented to generate a quadrupole field in the vector 122_31C_2 direction. Each foregoing micro-compensator can also be an octupole or 8-pole lens (with eight electrodes whose inner surfaces form a cylindrical surface) which can generate a quadrupole field in any directions and one round-lens field. In this case, all the micro-compensators can have same configurations and be placed in same orientations.

For an apparatus using a lot of beamlets, it may be difficult to manufacture a large number of 8-pole lenses or 4-pole lenses each with a specific orientation. In addition, for one micro-compensator to compensate both field curvature aberration and astigmatism aberration, the excitation voltages of the multiple electrodes may be larger than the safety limitations of electric breakdown. To solve the foregoing issues, each micro-compensator can be formed by two or more sub micro-compensators, and accordingly is called as a combined one. In this case, the micro-compensator array 122_C can be formed by two or more micro-compensator layers placed along the primary optical axis 200_1. Each micro-compensator layer has a plurality of sub micro-compensators, each sub micro-compensator in one layer is aligned with one sub micro-compensator in every other layer, and all the sub micro-compensators aligned with each other form one foregoing combined micro-compensator. FIG. 5A and FIG. 5B respectively show one micro-compensator array 122_C with two and three micro-compensator layers.

In the micro-compensator array 122_C in FIG. 5A, counting from the beamlet entering side, the first micro-compensator layer 122_C-1 has three first sub micro-compensators 122_1C-1, 122_2C-1 and 122_3C-1, and the second micro-compensator layer 122_C-2 has three second sub micro-compensators 122_1C-2, 122_2C-2 and 122_3C-2. One first sub micro-compensator and one second sub micro-compensator are aligned with each other and form a combined micro-compensator with respect to one beamlet. For example, the first sub micro-compensator 122_2C-1 and the second sub micro-compensator 122_2C-2 form one combined micro-compensator 122_2C in FIG. 3 with respect to the beamlet 102_2 and are aligned with the optical axis 122_2C_1 thereof.

For each combined micro-compensator in FIG. 5A, in one case the first sub micro-compensator and the second sub micro-compensator can respectively be a 4-pole lens and have a 45° difference in azimuth or orientation. For example, the first and second micro-compensator layers can have the configurations 122_C-n shown in FIG. 6A and FIG. 6B respectively, wherein all the sub micro-compensators in each layer are same in orientation. In this way, the round-lens field for compensating the field curvature aberration can be generated by either or both of the upper and lower 4-pole lenses, and the quadrupole field for compensating the astigmatism aberration can be generated by both of the upper and lower 4-pole lenses. In another case, one of the first sub micro-compensator and the second sub micro-compensator can be a 4-pole lens in a specific orientation or an 8-pole lens in any orientation and the other can be a round lens. For example the first and second micro-compensator layers can have the configurations in FIG. 4 and FIG. 6C. The 4-pole lens or the 8-pole lens generates the quadrupole field for compensating the astigmatism aberration, and the round lens generates the round-lens field for compensating the field curvature aberration. In FIG. 6C, each round lens such as 122_2C-n is formed by one circular electrode. If the compensated field curvature aberration is very large, the excitation voltage of the circular electrode in the corresponding round lens may be so large that a discharge is easy to happen. In this situation, the 4-pole lens or the 8-pole lens can further generate an auxiliary round-lens field, the round lens generates a main round-lens field, and the field curvature aberration is compensated by both auxiliary and main round-lens fields. By this way, the excitation voltage of the circular electrode can be reduced and within a safe range.

In comparison with FIG. 5A, the micro-compensator array 122_C in FIG. 5B further comprises one third micro-compensator layer 122_C-3 with three third sub micro-compensators 122_1C-3, 122_2C-3 and 122_3C-3. One first sub micro-compensator, one second sub micro-compensator and one third sub micro-compensator are aligned with each other and form a combined micro-compensator with respect to one beamlet. For example, the first, second and third sub micro-compensators 122_2C-1, 122_2C-2 and 122_2C-3 form one combined micro-compensator 122_2C in FIG. 3 with respect to the beamlet 102_2 and are aligned with the optical axis 122_2C_1 thereof.

For each combined micro-compensator in FIG. 5B, in one case, one of the first, second and third sub micro-compensators can be a round lens, and the others can respectively be a 4-pole lens and have a 45° difference in azimuth or orientation. As mentioned above, the field curvature aberration can be compensated by the round lens only or the round lens and one or both of the two 4-pole lenses together, and the astigmatism aberration can be compensated by both of the two 4-pole lenses. In another case, one of the first, second and third sub micro-compensators can be a 4-pole lens in a specific orientation or an 8-pole lens, and the others can respectively be a round lens. In this way, the field curvature aberration can be compensated by the two round lenses only or the tow round lenses and the 4-pole or 8-pole lens together, and the astigmatism aberration can be compensated by the 4-pole or 8-pole lenses.

FIG. 7 shows another embodiment of the modified source-conversion unit 120 in one first-type apparatus 300A, which comprises one micro-deflector-and-compensator array 122_DC and one micro-compensator array 122_C. The micro-deflector-and-compensator array 122_DC deflects a plurality of beamlets to form a plurality of virtual images of the single electron source 101s, and compensates parts of the field curvature and/or astigmatism aberrations of the plurality of probe spots on the sample surface 7. The micro-compensator array 122_C compensates the left parts of the field curvature and/or astigmatism aberrations. Accordingly the micro-deflector-and-compensator array 122_DC and micro-compensator array 122_C can employ some configurations in CROSS REFERENCE or mentioned above. For example, in one case, the micro-compensator array 122_C can comprise a plurality of round lenses as shown in FIG. 6C, and the micro-deflector-and-compensator array 122_DC can comprise a plurality of 4-pole lenses each in a specific orientation, or a plurality of 8-pole lenses, or a plurality of pairs of 4-pole lenses as described in CROSS REFERENCE.

FIG. 8 shows another embodiment of the modified source-conversion unit 120 in one first-type apparatus 400A. Different from the modified source-conversion 120 in FIG. 3, the beamlet-limit means 121 is placed between the micro-deflector array 122_D and the micro-compensator array 122-C. Because the peripheral electrons of each beamlet have been cut off before entering the corresponding micro-compensator, the damages thereof (such as charging up and contamination) due to the peripheral electrons can be avoided. In addition, the beamlet-limit means 121 can also be above the image-forming means 122. In this case, the Coulomb Effect can be reduced earlier than before, but the scattering electrons generated when each beamlet passes through one image-forming element of the image-forming means will enlarge the corresponding probe spot and/or become a background noise.

To further reduce the impact of Coulomb Effect, the main aperture plate 171 in one multi-beam apparatus can be placed above the condenser lens 110 and preferred as close to the single electron source 101 as possible. In this way, peripheral electrons can be cut off as earlier as possible. To further cut the electrons not in use as much as possible, the main aperture plate 171 with one large opening can be replaced by a Coulomb-effect-reduction means 172 with plural Coulomb-effect-reduction openings, as shown in FIG. 9. The primary electron beam 102 is changed into three beamlets 102_1, 102_2 and 102_3 by three Coulomb-effect-reduction openings, and the currents of the three beamlets 102_1, 102_2 and 102_3 are limited by the three beamlet-limit openings of the beamlet-limit means 121.

In the foregoing embodiments of the modified source-conversion unit 120, to operate one micro-deflector, a driving-circuit needs connecting with each electrode thereof. To prevent the driving-circuit from being damaged by the primary electron beam 102 or the beamlet, it is better placing one electric-conduction plate above the electrodes of all the micro-deflectors. In addition, the deflection of each beamlet is better finished within a limited range so as to ensure a normal incidence onto the corresponding beamlet-limit opening and/or micro-compensator. Therefore it is better to use two electric-conduction plates to sandwich the multiple electrodes of every micro-deflector.

Similarly, to operate one micro-compensator, a driving-circuit needs connecting with each electrode thereof. To prevent the driving-circuits from being damaged by the beamlet and/or the scattered electrons thereof, it is better placing one electric-conduction plate above the electrodes of all the micro-compensators. The aberration compensation of each beamlet is better finished within a limited range so as to avoid the interferences with the other electron optical elements (such as the primary projection imaging system, other micro-compensators or micro-deflectors). The interferences will incur additional aberrations. Therefore it is better to use two electric-conduction plates to sandwich the multiple electrodes of every micro-compensator.

Accordingly, FIG. 10A and FIG. 10B respectively show one overall embodiment of the source-conversion unit 120 in FIG. 3. The beamlet-limit means 121 is a beamlet-limit electric-conduction plate with plural beamlet-limit openings (such as 121_1~121_3). In the micro-deflector array 122_D in FIG. 10A, the electrodes of the plural micro-deflectors (such as 122_1D~122_3D) are sandwiched by one first-upper insulator plate 122-IL1 with plural first-upper orifices and one first-lower insulator plate 122-IL2 with plural first-lower orifices, and one first-upper electric-conduction plate 122-CL1 with plural first-upper through-holes and one first-lower electric-conduction plate 122-CL2 with plural first-lower through-holes sandwich the first-upper insulator plate 122-IL1 and the first-lower insulator plate 122-IL2. The plural first-upper through-holes, the plural first-upper orifices, the plural first-lower orifices and the plural first-lower through-holes are aligned with the plural micro-deflectors respectively. To avoid charging-up on the inner sidewalls of the plural first-upper and first-lower orifices, the plural first-upper through-holes are equal to or smaller than the plural first-upper orifices in radial dimensions respectively, and the radial dimensions of the plural first-lower orifices are larger than the inner radial dimensions of the electrodes of the plural micro-deflectors respectively.

In the micro-compensator array 122_C in FIG. 10A, the electrodes of the plural micro-compensators (such as 122_1C-122_3C) are sandwiched by one second-upper insulator plate 122-IL3 with plural second-upper orifices and one second-lower insulator plate 122-IL4 with plural second-lower orifices, and one second-upper electric-conduction plate 122-CL3 with plural second-upper through-holes and one second-lower electric-conduction plate 122-CL4 with plural second-lower through-holes sandwich the second-upper insulator plate 122-IL3 and the second-lower insulator plate 122-IL4. The plural second-upper through-holes, the plural second-upper orifices, the plural second-lower orifices and the plural second-lower through-holes are aligned with the plural micro-compensators respectively. To avoid charging-up on the inner sidewalls of the plural second-upper and second-lower orifices, the plural second-upper through-holes are equal to or smaller than the plural second-upper orifices in radial dimensions respectively, and the radial dimensions of the plural second-lower orifices are larger than the inner radial dimensions of the electrodes of the plural micro-compensators respectively.

To reduce the possibility of beamlet incurring electron scattering, each first-upper through-hole, each second-upper through-hole and each beamlet-limit opening are respectively preferred in an upside-down funnel shape (i.e. the small end is on the beamlet-incident side).

The embodiment of the source-conversion unit 120 in FIG. 10A can be compacted for simplifications in structure and manufacturing. For example, the micro-deflector array 122_D, the micro-compensator 122_C and the beamlet-limit electric-conduction plate 121 can be placed to connect together. That is the second-upper electric-conduction plate 122-CL3 touches the first-lower electric-conduction plate 122-CL2, and the beamlet-limit electric-conduction plate 121 is attached to the second-lower electric-conduction plate 122-CL4. Furthermore, one of the second-upper electric-conduction plate 122-CL3 and the first-lower electric-conduction plate 122-CL2 can be removed, and therefore the micro-deflector array 122_D and the micro-compensator array 122_C share the left one. FIG. 10B shows the case where the first-lower electric-conduction plate 122-CL2 is remained. Moreover, the second-lower electric-conduction plate 122-CL4 can be removed, and its function can be performed by the beamlet-limit electric-conduction plate 121 which can be placed to touch the second-lower insulator plate 122-IL4.

FIG. 11A shows one overall embodiment of the source-conversion unit 120 in FIG. 8, which is basically similar to the one in FIG. 11A except the beamlet-limit electric-conduction plate 121 is between the micro-deflector array 122_D and the micro-compensator array 122_C. In this case, each second-upper through-hole can have a cylindrical shape, but an upside-down funnel shape as shown in FIG. 11A is preferred for reducing scattering of stray electrons. FIG. 11B shows one more compacted embodiment. The micro-deflector array 122_D, the beamlet-limit electric-conduction plate 121 and the micro-compensator array 122_C are connected together. The first-lower electric-conduction plate 122-CL2 and the second-upper electric-conduction plate 122-CL3 are removed and the functions thereof are performed by the beamlet-limit electric-conduction plate 121.

In summary, the source-conversion unit of a conventional multi-beam apparatus in CROSS REFERENCE performs the image-forming function and the aberration-compensation function simultaneously, and therefore the aberration-compensation function generates undesired aberrations due to beamlet tilting/shifting. This invention modifies the source-conversion unit to perform the image-forming function and aberration-compensation function separately. The image-forming function is carried out after the image-forming function has deflected each beamlet to be locally on-axis with respect to one corresponding micro-compensator. Hence, other than the desired field curvature aberration and the astigmatism aberration, each micro-compensator will not generate additional aberrations due to beamlet tilting/shifting. The additional aberrations will increase the sizes of plural probe spots and deteriorate image resolution of the apparatus. Accordingly, in one modified source-conversion unit, the image-forming means comprises one micro-deflector array with plural micro-deflectors and one micro-compensator array with plural micro-compensators, and each micro-deflector is aligned with one micro-compensator. Each micro-deflector and each micro-compensator respectively is a multipole lens. To make the modified source-conversion unit easy in manufacturing and electric control, each micro-compensator can be formed by two or more sub micro-compensators, and accordingly the micro-compensator array comprises two or more micro-compensator layers each with plural sub micro-compensators. To keep the modified source-conversion unit safe in electric control and less in interference of deflecting and compensating fields, the electrodes of all the micro-deflectors and micro-compensators can be covered by electric-conduction plates. The invention also proposes a method to reduce the impact of Coulomb Effect as much as possible in one multi-beam apparatus. A Coulomb-effect-reduction means with plural Coulomb-effect-reduction openings is placed close to the single electron source of the apparatus and therefore the electrons not in use can be cut off as early as possible.

Although the present invention has been explained in relation to its preferred embodiment, it is to be understood that other modifications and variation can be made without departing the spirit and scope of the invention as hereafter claimed.

What is claimed is:

1. A source-conversion unit of an electron source, comprising:
   an image-forming means; and
   a beamlet-limit means with a plurality of beamlet-limit openings,
   wherein said image-forming means comprises a micro-deflector array with a plurality of micro-deflectors and a micro-compensator array with a plurality of micro-compensators, and each micro-deflector is aligned with one micro-compensator and one beamlet-limit opening,
   wherein said each micro-deflector deflects one beamlet of an electron beam generated by said electron source to forms one virtual image thereof and enter said one micro-compensator along an optical axis thereof, said one micro-compensator influences said one beamlet to add certain amounts of astigmatism aberration and/or field curvature aberration to said virtual image, and said one beamlet-limit opening cuts off peripheral electrons of said one beamlet and thereby limiting a current thereof.

2. The source-conversion unit according to claim 1, wherein said one micro-compensator comprises a plurality of combined sub micro-compensators.

3. The source-conversion unit according to claim 2, wherein said micro-compensator array comprises a first micro-compensator layer with a plurality of first sub micro-compensators and a second micro-compensator layer with a plurality of second sub micro-compensators, one first sub micro-compensator and one second sub micro-compensator aligned with each other are two of said plurality of combined sub micro-compensators.

4. The source-conversion unit according to claim 3, wherein for said one micro-compensator, said first sub micro-compensator and said second sub micro-compensator are respectively a 4-pole lens and have a 45° difference in orientation.

5. The source-conversion unit according to claim 3, wherein said micro-compensator array comprises a third micro-compensator layer with a plurality of third sub micro-compensators, and one third sub micro-compensator aligned with said second sub micro-compensator is one of said plurality of combined sub micro-compensators.

6. The source-conversion unit according to claim 5, wherein for said one micro-compensator, said first sub micro-compensator and said second sub micro-compensator are respectively a 4-pole lens and have a 45° difference in orientation, and said third sub micro-compensator is a round-lens.

7. The source-conversion unit according to claim 1, wherein said beamlet-limit means is below said micro-deflector array.

8. The source-conversion unit according to claim 1, further comprising a first-upper electric-conduction plate with a plurality of first-upper through-holes and a first-lower electric-conduction plate with a plurality of first-lower through-holes, which are respectively above and below electrodes of said plurality of micro-deflectors to avoid radiation damage due to said electron beam and keep electric fields thereof therebetween.

9. The source-conversion unit according to claim 1, further comprising a second-upper electric-conduction plate with a plurality of second-upper through-holes and a second-lower electric-conduction plate with a plurality of second-lower through-holes, which are respectively above and below electrodes of said plurality of micro-compensators to avoid radiation damage due to corresponding beamlets and keep electric fields thereof therebetween.

10. A multi-beam apparatus, comprising:
    an electron source;
    a condenser lens below said electron source;
    a source-conversion unit below said condenser lens;
    a primary projection imaging system below said source-conversion unit and comprising an objective lens;
    a deflection scanning unit inside said primary projection imaging system;
    a sample stage below said primary projection imaging system;
    a beam separator above said objective lens;

a secondary projection imaging system above said beam separator; and an electron detection device with a plurality of detection elements, wherein said source-conversion unit comprises an image-forming means and a beamlet-limit means with a plurality of beam-limit openings, and said image-forming means comprises a micro-deflector array with a plurality of micro-deflectors and a micro-compensator array with a plurality of micro-compensators, said beamlet-limit means is below said micro-deflector array, and an optical axis of each micro-compensator is parallel to a primary optical axis of said apparatus and aligned with one of said plurality of micro-deflectors and one of said plurality of beamlet-limit openings, wherein said electron source, said condenser lens, said source-conversion unit, said primary projection imaging system, said deflection scanning unit and said beam separator are aligned with said primary optical axis, said secondary projection imaging system and said electron detection device are aligned with a secondary optical axis of said apparatus, and said secondary optical axis is not parallel to said primary optical axis, wherein said sample stage sustains a sample with a being-observed surface facing to said objective lens, wherein said electron source generates a primary electron beam along said primary optical axis, said plurality of micro-deflectors respectively deflects a plurality of beamlets of said primary electron beam to be incident onto said plurality of micro-compensators along optical axes thereof and therefore form a plurality of parallel virtual images of said electron source, and said plurality of micro-compensators respectively influences said plurality of beamlets with certain amounts of astigmatism aberrations and/or field curvature aberrations, wherein said plurality of beam-limit openings respectively cuts off peripheral electrons of said plurality of beamlets and therefore limits currents thereof, and said currents can be varied together by adjusting focusing power of said condenser lens, wherein said primary projection imaging system focuses said plurality of beamlets, images said plurality of parallel virtual images onto said surface and forms a plurality of probe spots thereon, said certain amounts of astigmatism aberrations and/or field curvature aberrations compensate astigmatism aberrations and/or field curvature aberrations generated by said condenser lens and/or said primary projection imaging system so as to reduce sizes of said plurality of probe spots, wherein said deflection scanning unit deflects said plurality of beamlets to scan said plurality of probe spots respectively over a plurality of scanned regions within an observed area on said surface, wherein a plurality of secondary electron beams is generated by said plurality of probe spots respectively from said plurality of scanned regions and in passing focused by said objective lens, said beam separator then deflects said plurality of secondary electron beams to said secondary projection imaging system, said secondary projection imaging system focuses and keeps said plurality of secondary electron beams to be detected by said plurality of detection elements respectively, and each detection element therefore provides an image signal of one corresponding scanned region.

11. The multi-beam apparatus according to claim 10, wherein said each micro-compensator comprises a plurality of combined sub micro-compensators.

12. The multi-beam apparatus according to claim 11, wherein said micro-compensator array comprises a first micro-compensator layer with a plurality of first sub micro-compensators and a second micro-compensator layer with a plurality of second sub micro-compensators, and one first sub micro-compensator and one second sub micro-compensator aligned with each other are two of said plurality of combined sub micro-compensators.

13. The multi-beam apparatus according to claim 12, wherein for said each micro-compensator, said first sub micro-compensator and said second sub micro-compensator are respectively a 4-pole lens and have a 45° difference in orientation.

14. The multi-beam apparatus according to claim 12, wherein said micro-compensator array comprises a third micro-compensator layer with a plurality of third sub micro-compensators, and one third sub micro-compensator aligned with said second sub micro-compensator is one of said plurality of combined sub micro-compensators.

15. The multi-beam apparatus according to claim 14, wherein for said each micro-compensator, said first sub micro-compensator and said second sub micro-compensator are respectively a 4-pole lens and have a 45° difference in orientation, and said third sub micro-compensator is a round-lens.

16. The multi-beam apparatus according to claim 10, wherein said image-forming means comprises a first-upper electric-conduction plate with a plurality of first-upper through-holes and a first-lower electric-conduction plate with a plurality of first-lower through-holes, which are respectively above and below electrodes of said plurality of micro-deflectors to avoid radiation damage due to said primary electron beam and keep electric fields thereof therebetween.

17. The multi-beam apparatus according to claim 10, wherein said image-forming means comprises a second-upper electric-conduction plate with a plurality of second-upper through-holes and a second-lower electric-conduction plate with a plurality of second-lower through-holes, which are respectively above and below electrodes of said plurality of micro-compensators to avoid radiation damage due to corresponding beamlets and keep electric fields thereof therebetween.

18. The multi-beam apparatus according to claim 10, further comprising a Coulomb-effect-reduction means which is between said electron source and said condenser lens and comprises a plurality of Coulomb-effect-reduction openings, wherein most electrons within said primary electron beam and not constituting said plurality of beamlets, will not pass through said plurality of Coulomb-effect-reduction openings.

19. A method to configure a source-conversion unit of an electron source, comprising:

providing an image-forming means with a micro-deflector array and a micro-compensator array; and providing a beamlet-limit means with a plurality of beamlet-limit openings, wherein said micro-deflector array comprises a plurality of micro-deflectors, said micro-compensator array comprises a plurality of micro-compensators, and each micro-deflector is aligned with one micro-compensator and one beamlet-limit opening, wherein said each micro-deflector deflects one beamlet of an electron beam generated by said electron source to form one virtual image thereof and be incident onto said one micro-compensator along an optical axis thereof, said one micro-compensator influences said one beamlet to add certain amounts of astigmatism aberration and/or field curvature aberration to said one virtual image, and said one beamlet-limit opening cuts off peripheral electrons of said one beamlet and thereby limiting a current thereof.

20. The method according to claim 19, further comprising a step of providing a first-upper electric-conduction plate with a plurality of first-upper through-holes and a first-lower electric-conduction plate with a plurality of first-lower through-holes respectively, which are respectively above and below electrodes of said plurality of micro-deflectors to avoid generating radiation damage due to said electron beam and keep electric fields thereof therebetween.

21. The method according to claim 19, further comprising a step of providing a second-upper electric-conduction plate with a plurality of second-upper through-holes and a second-lower electric-conduction plate with a plurality of second-lower through-holes, which are respectively above and below electrodes of said plurality of micro-compensators to avoid generating radiation damage due to corresponding beamlets and keep electric fields thereof therebetween.

22. A method to obtain a plurality of sub-sources from an electron source, comprising:
- a step of performing an image-forming function by a plurality of micro-deflectors;
- a step of performing an aberration-compensation function by a plurality of micro-compensators; and
- a step of performing a current-limit function by plurality of beamlet-limit apertures,
- wherein said image-forming function provides a plurality of parallel virtual images of said electron source and each virtual image becomes one of said plurality of sub-sources, said aberration-compensation function adds certain amounts of specific aberrations to said plurality of sub-sources respectively, and said current-limit function limits currents of said plurality of sub-sources respectively,
- wherein said plurality of micro-deflectors respectively deflect a plurality of beamlets of an electron beam generated by said electron source, and said plurality of beamlets forms said plurality of parallel virtual images and enters said plurality of micro-compensators along optical axes thereof,
- wherein said plurality of micro-compensators respectively influence said plurality of beamlets with said certain amounts of specific aberrations,
- wherein said plurality of beamlet-limit apertures cuts off peripheral electrons of said plurality of beamlets to limit currents thereof.

23. A source-conversion unit, comprising:
- means for forming a plurality of virtual images of a single charged-particle source generating a charged-particle beam, by using a plurality of micro-deflectors and a plurality of micro-compensators in sequence, wherein the plurality of micro-deflectors converts the charged-particle beam into a plurality of parallel beamlets and forms the plurality of virtual images respectively, wherein the plurality of micro-compensators respectively compensates aberrations of the plurality of virtual images; and
- means for limiting a current of each of the plurality of beamlets.

* * * * *